(12) United States Patent
Wang et al.

(10) Patent No.: US 12,436,424 B2
(45) Date of Patent: Oct. 7, 2025

(54) LIGHT-EMITTING MODULE, LIGHT-EMITTING SUBSTRATE, AND DISPLAY DEVICE

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Yu Wang, Beijing (CN); Wencheng Luo, Beijing (CN); Meilong Hu, Beijing (CN); Jinhong Zhang, Beijing (CN); Wei Ran, Beijing (CN); Wenqi Quan, Beijing (CN); Zhi Li, Beijing (CN); Hening Zhang, Beijing (CN); Bowen Xiong, Beijing (CN); Qiong Yuan, Beijing (CN); Xin Cen, Beijing (CN); Ke Liao, Beijing (CN)

(73) Assignees: CHONGQING BOE OPTOELECTRONICS TECHNOLOGY CO., LTD., Chongqing (CN); BOE TECHNOLOGY GROUP, CO., LTD., Beijing (CN)

( * ) Notice: Subject to any disclaimer, the term of this patent is extended or adjusted under 35 U.S.C. 154(b) by 0 days.

(21) Appl. No.: 18/261,797

(22) PCT Filed: Jun. 29, 2022

(86) PCT No.: PCT/CN2022/102307
§ 371 (c)(1),
(2) Date: Jul. 17, 2023

(87) PCT Pub. No.: WO2024/000256
PCT Pub. Date: Jan. 4, 2024

(65) Prior Publication Data
US 2024/0411175 A1    Dec. 12, 2024

(51) Int. Cl.
G02F 1/00        (2006.01)
G02F 1/1335      (2006.01)
G02F 1/13357     (2006.01)

(52) U.S. Cl.
CPC .. *G02F 1/133603* (2013.01); *G02F 1/133612* (2021.01)

(58) Field of Classification Search
None
See application file for complete search history.

(56) References Cited

U.S. PATENT DOCUMENTS

| | | | |
|---|---|---|---|
| 2011/0050556 A1 | 3/2011 | Bae et al. | |
| 2011/0050735 A1* | 3/2011 | Bae | G02B 6/0073 362/235 |

(Continued)

FOREIGN PATENT DOCUMENTS

| | | |
|---|---|---|
| CN | 101382274 A | 3/2009 |
| CN | 201621563 U | 11/2010 |

(Continued)

OTHER PUBLICATIONS

The International Search Report dated Dec. 26, 2022; PCT/CN2022/102307.

(Continued)

*Primary Examiner* — Gerald J Sufleta, II
(74) *Attorney, Agent, or Firm* — Frank Gao, Esq.

(57) ABSTRACT

A light-emitting module, a light-emitting substrate, and a display device are provided. The light-emitting module includes a plurality of light-emitting elements, the plurality of light-emitting elements are arranged in a row direction and a column direction, the plurality of light-emitting elements are formed into a plurality of columns of light-emitting elements, at least one column of light-emitting elements among the plurality of columns of light-emitting (Continued)

elements include a first light-emitting element, a second light-emitting element, a third light-emitting element, and a fourth light-emitting element that are arranged sequentially, and the second light-emitting element and the fourth light-emitting element are arranged on both sides of a center connection line of the first light-emitting element and the third light-emitting element, respectively.

19 Claims, 9 Drawing Sheets

(56) References Cited

U.S. PATENT DOCUMENTS

| | | | |
|---|---|---|---|
| 2011/0051037 A1 | 3/2011 | Kim et al. | |
| 2012/0113328 A1* | 5/2012 | Takeshima | G02F 1/133603 257/88 |
| 2015/0091787 A1* | 4/2015 | Ohmae | F21K 9/00 345/83 |
| 2016/0146435 A1 | 5/2016 | Son et al. | |
| 2017/0069805 A1 | 3/2017 | Nagahama et al. | |
| 2020/0312832 A1 | 10/2020 | Chi et al. | |
| 2021/0233969 A1* | 7/2021 | Sun | H10K 59/122 |
| 2021/0408110 A1 | 12/2021 | Guan et al. | |

FOREIGN PATENT DOCUMENTS

| | | |
|---|---|---|
| CN | 102374406 A | 3/2012 |
| CN | 102472914 A | 5/2012 |
| CN | 102483538 A | 5/2012 |
| CN | 202327843 U | 7/2012 |
| CN | 105487294 A | 4/2016 |
| CN | 105627111 A | 6/2016 |
| CN | 205824702 U | 12/2016 |
| CN | 107035979 A | 8/2017 |
| CN | 110827706 A | 2/2020 |
| CN | 111290174 A | 6/2020 |
| CN | 212160297 U | 12/2020 |
| CN | 214041942 U | 8/2021 |
| CN | 113759601 A | 12/2021 |
| KR | 20110029273 A | 3/2011 |

OTHER PUBLICATIONS

The Extended European Search Report dated Feb. 27, 2025; Appln. No. 22948374.8.

* cited by examiner

LIGHT-EMITTING MODULE, LIGHT-EMITTING SUBSTRATE, AND DISPLAY DEVICE

This application is the National Stage of International Application No. PCT/CN2022/102307, filed Jun. 29, 2022, which is hereby incorporated by reference in their entirety.

TECHNICAL FIELD

Embodiments of the present disclosure relate to a light-emitting module, a light-emitting substrate, and a display device.

BACKGROUND

Compared with a traditional display screen, a display screen including sub-millimeter light-emitting diodes (Mini-LEDs) has better display effect, higher contrast, and longer life. In addition, compared with the organic light-emitting diode (OLED) display, Mini-LED has more diversity in product composition and higher yield.

Mini-LED products combine unique advantages of the traditional liquid crystal display (LCD) device and the organic light-emitting diode (OLED) display device, while avoiding respective disadvantages of the traditional liquid crystal display (LCD) device and the organic light-emitting diode (OLED) display device.

SUMMARY

Embodiments of the present disclosure provide a light-emitting module, a light-emitting substrate, and a display device.

Embodiments of the present disclosure provide a light-emitting module, including a plurality of light-emitting elements, the plurality of light-emitting elements are arranged in a row direction and a column direction, the plurality of light-emitting elements are formed into a plurality of columns of light-emitting elements, at least one column of light-emitting elements among the plurality of columns of light-emitting elements includes a first light-emitting element, a second light-emitting element, a third light-emitting element, and a fourth light-emitting element that are arranged sequentially, and the second light-emitting element and the fourth light-emitting element are arranged on both sides of a center connection line of the first light-emitting element and the third light-emitting element, respectively.

For example, two adjacent rows of light-emitting elements are arranged in a staggered manner, each two adjacent rows of light-emitting elements constitute a light-emitting element group, different light-emitting element groups include different light-emitting elements, and staggered directions of two adjacent light-emitting element groups are opposite to each other.

For example, the plurality of light-emitting elements further include a fifth light-emitting element and a sixth light-emitting element, the fifth light-emitting element and the sixth light-emitting element are located in a same row as the second light-emitting element and are adjacent to the second light-emitting element, respectively, a distance from the fifth light-emitting element to the center connection line of the first light-emitting element and the third light-emitting element is greater than a distance from the sixth light-emitting element to the center connection line of the first light-emitting element and the third light-emitting element, and a distance from the second light-emitting element to the center connection line of the first light-emitting element and the third light-emitting element is less than the distance from the sixth light-emitting element to the center connection line of the first light-emitting element and the third light-emitting element.

For example, the distance from the sixth light-emitting element to the center connection line of the first light-emitting element and the third light-emitting element is 3 to 10 times the distance from the second light-emitting element to the center connection line of the first light-emitting element and the third light-emitting element.

For example, the plurality of light-emitting elements further include a seventh light-emitting element and an eighth light-emitting element, the seventh light-emitting element and the eighth light-emitting element are located in a same row as the fourth light-emitting element and are adjacent to the fourth light-emitting element, respectively, a distance from the seventh light-emitting element to the center connection line of the first light-emitting element and the third light-emitting element is less than a distance from the eighth light-emitting element to the center connection line of the first light-emitting element and the third light-emitting element, and a distance from the fourth light-emitting element to the center connection line of the first light-emitting element and the third light-emitting element is less than the distance from the seventh light-emitting element to the center connection line of the first light-emitting element and the third light-emitting element.

For example, the distance from the seventh light-emitting element to the center connection line of the first light-emitting element and the third light-emitting element is 3 to 10 times the distance from the fourth light-emitting element to the center connection line of the first light-emitting element and the third light-emitting element.

For example, a distance from a center of the second light-emitting element to the center connection line of the first light-emitting element and the third light-emitting element is equal to a distance from a center of the fourth light-emitting element to the center connection line of the first light-emitting element and the third light-emitting element.

For example, a center connection line of the second light-emitting element, the third light-emitting element, and the fourth light-emitting element is on a straight line.

For example, an included angle between a center connection line of the first light-emitting element and the second light-emitting element and the straight line, where the center connection line of the second light-emitting element, the third light-emitting element, and the fourth light-emitting element is located, is an obtuse angle.

For example, the obtuse angle is greater than or equal to 120 degrees and less than or equal to 160 degrees.

For example, distances between two adjacent light-emitting elements located in a same row are equal to each other.

For example, the light-emitting module includes two edges opposite to each other and extending in the column direction, and a center connection line of light-emitting elements in one column of light-emitting elements closest to each edge of the two edges extending in the column direction is a polyline.

For example, the light-emitting module includes two edges opposite to each other and extending in the column direction, and a center connection line of light-emitting elements in one column of light-emitting elements closest to each edge of the two edges extending in the column direction is a straight line.

For example, the light-emitting module includes two edges opposite to each other and extending in the row direction, and a center connection line of light-emitting elements in one row of light-emitting elements closest to each edge of the two edges extending in the row direction is a straight line.

For example, the plurality of columns of light-emitting elements include a plurality of first-type columns of light-emitting elements and a plurality of second-type columns of light-emitting elements, a center connection line of light-emitting elements of each first-type column of light-emitting elements of the plurality of first-type column of light-emitting elements is a polyline, a center connection line of light-emitting elements of each second-type column of light-emitting elements of the plurality of second-type columns of light-emitting elements is a straight line, and the plurality of first-type columns of light-emitting elements are located between two second-type columns of light-emitting elements of the plurality of second-type columns of light-emitting elements.

For example, a distance between light-emitting elements, with a center connection line of a polyline, of one column of light-emitting elements closest to an edge of the light-emitting module extending in the column direction and light-emitting elements, with a center connection line of a straight line, of one column of light-emitting elements closest to the edge of the light-emitting module extending in the column direction decreases first and then gradually increases or increases first and then gradually decreases in the column direction.

For example, the light-emitting module is in a shape of a rectangle and is provided with four edges, a center connection line of light-emitting elements closest to each edge of the four edges is a straight line, and each column of light-emitting elements located in a rectangular frame formed by four straight lines is a column of light-emitting elements with a center connection line of a polyline.

For example, each of the plurality of light-emitting elements includes a first electrode and a second electrode, and an arrangement direction of the first electrode and the second electrode of one of two adjacent light-emitting elements located in a same row is different from an arrangement direction of the first electrode and the second electrode of the other of the two adjacent light-emitting elements located in the same row.

For example, the arrangement direction of the first electrode and the second electrode of one of two adjacent light-emitting elements located in the same row is opposite to the arrangement direction of the first electrode and the second electrode of the other of the two adjacent light-emitting elements located in the same row.

For example, each of the plurality of light-emitting elements is provided with a long axis and a short axis, an extending direction of the long axis is perpendicular to an extending direction of the short axis, a length of the long axis is greater than a length of the short axis, and the arrangement direction of the first electrode and the second electrode of the light-emitting element is the extending direction of the long axis.

For example, the extending direction of the long axis of the light-emitting element in one of an odd-numbered column and an even-numbered column is the column direction, and the extending direction of the long axis of the light-emitting element in the other of the odd-numbered column and the even-numbered column is the row direction.

For example, an included angle between the extending direction of the long axis of at least one light-emitting element of the plurality of light-emitting elements and the row direction is greater than zero.

For example, the included angle between the extending direction of the long axis of at least one light-emitting element of the plurality of light-emitting elements and the row direction is greater than zero and less than or equal to 45 degrees.

For example, the extending direction of the long axis of one column of light-emitting elements of two adjacent columns of light-emitting elements is parallel to the column direction, and the extending direction of the long axis of the other column of light-emitting elements of the two adjacent columns of light-emitting elements is parallel to the row direction.

For example, a center connection line of light-emitting elements of one column of light-emitting elements of the plurality of columns of light-emitting elements is in a shape of a polyline, the center connection line includes a plurality of repeating portions, and an amount of light-emitting elements connected to each of the plurality of repeating portions of the center connection line is greater than three.

For example, the light-emitting module includes a plurality of partitions, the plurality of partitions are arranged in the row direction and the column direction, and each of the plurality of partitions includes at least two light-emitting elements of the plurality of light-emitting elements; and light-emitting elements in even-numbered rows of partitions are arranged in a same way, light-emitting elements in odd-numbered rows of partitions are arranged in a same way, and the light-emitting elements in the even-numbered rows of partitions are arranged in a different way from the light-emitting elements in the odd-numbered rows of partitions. Embodiments of the present disclosure further provide a light-emitting substrate including any one of the light-emitting modules as mentioned above.

Embodiments of the present disclosure further provide a display device, including any one of the light-emitting substrates as mentioned above.

BRIEF DESCRIPTION OF THE DRAWINGS

In order to clearly illustrate the technical solution of the embodiments of the present disclosure, the drawings of the embodiments will be briefly described. It is obvious that the described drawings in the following are only related to some embodiments of the present disclosure and thus are not limitative of the present disclosure.

DETAILED DESCRIPTION

In order to make objectives, technical details, and advantages of the embodiments of the present disclosure more clear, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment (s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the described object is changed, the relative position relationship may be changed accordingly.

Figure 1:
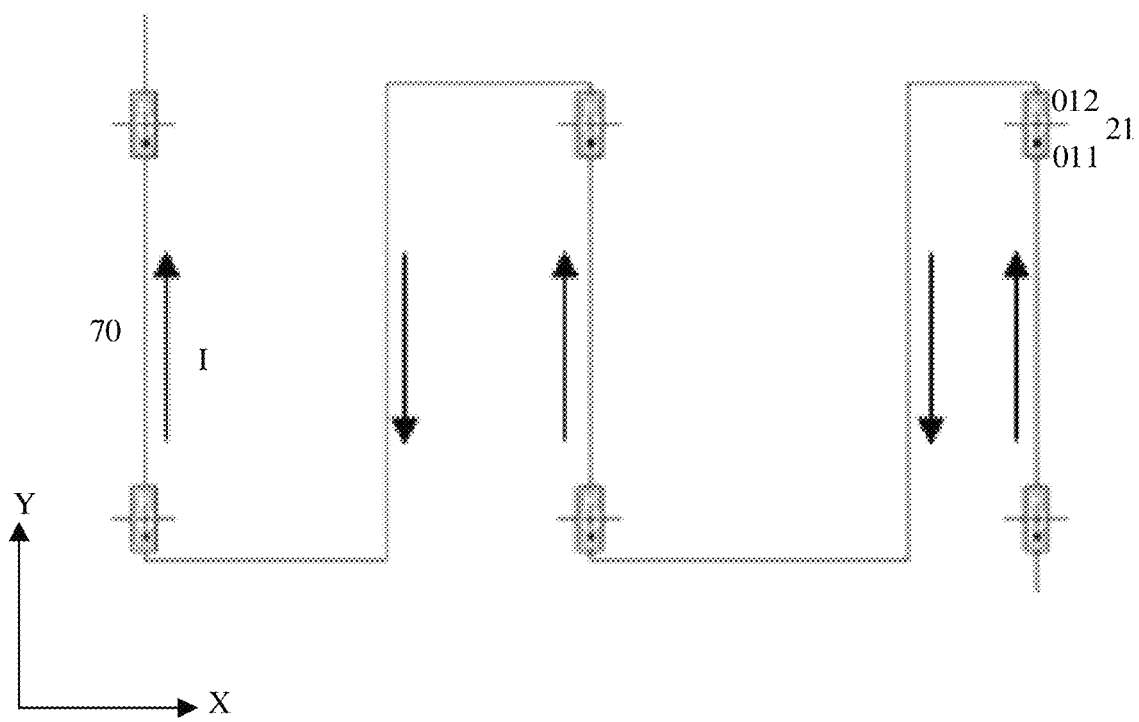
FIG. 1 is a schematic diagram of an arrangement of Mini-LEDs.
Figure 2:
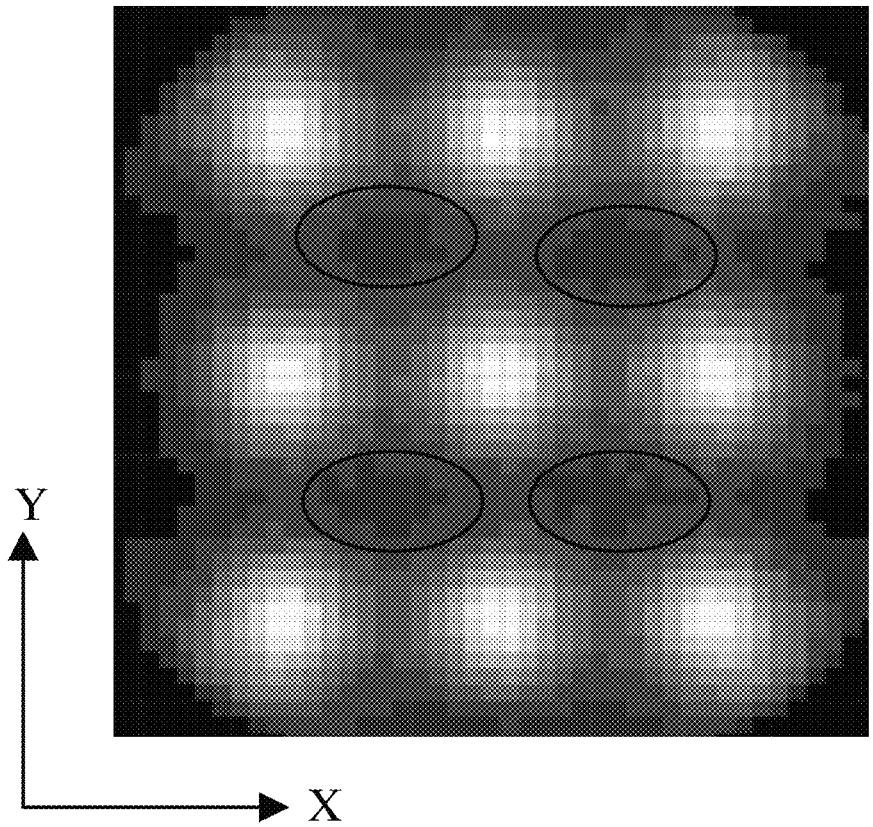
FIG. 2 is a diagram illustrating simulated light mixing effect of Mini-LEDs arranged in the way illustrated in FIG. 1.

FIG. 1 is a schematic diagram of an arrangement of Mini-LEDs. FIG. 2 is a diagram illustrating simulated light mixing effect of Mini-LEDs arranged in the way illustrated in FIG. 1.

As illustrated in FIG. 1, the arrangement of conventional Mini-LEDs mostly adopts a rectangular arrangement, and the simulated light mixing effect of this arrangement is illustrated in FIG. 2. FIG. 1 illustrates a plurality of Mini-LEDs 21. As illustrated in FIG. 1, each Mini-LED 21 includes an electrode 011 and an electrode 012, one of the electrode 011 and the electrode 012 is a P electrode, and the other of the electrode 011 and the electrode 012 is an N electrode.

For example, the Mini-LED refers to a LED with a chip size between 50 μm and 200 μm.

FIG. 1 illustrates a wire 70 and a current I in the wire 70. The arrow of the current I in FIG. 1 indicates the direction of the current.

For the rectangular arrangement solution, the light mixing effect between Mini-LEDs is poor, as illustrated in FIG. 2, the brightness of the region in the black ellipse is obviously weaker than the brightness of other positions, resulting in problems such as light shadow (Mura) and peripheral blueness. In addition, in order to consider the bonding efficiency, P electrodes and N electrodes of LEDs adopt an orderly way to place pads. However, the orderly arrangement of the P electrodes and N electrodes makes internal wires of a light-emitting substrate take up space, the wires are more complex, the current flows through a long line, and there are groups of reverse currents interacting with each other in the internal wires. There will mostly be a sound of current flowing through the wires, and groups of reverse currents interact to generate ampere force. When the ampere force of the entire light-emitting substrate is superimposed to a certain value, and the oscillation frequency that occurs is close to the same as the oscillation frequency at a contact point, a resonance phenomenon occurs, which causes noise.

Figure 3:
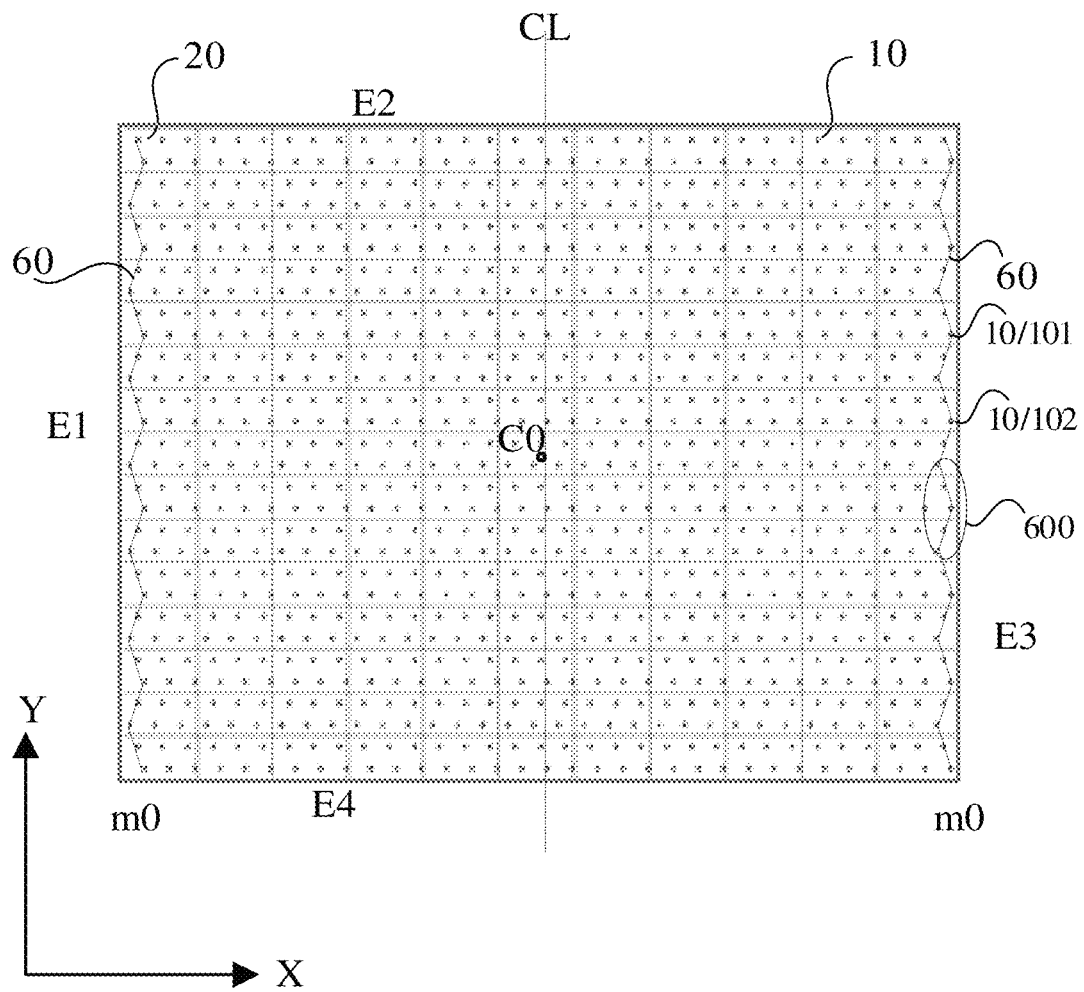
FIG. 3 is a schematic diagram of a light-emitting module provided by an embodiment of the present disclosure.
Figure 4:
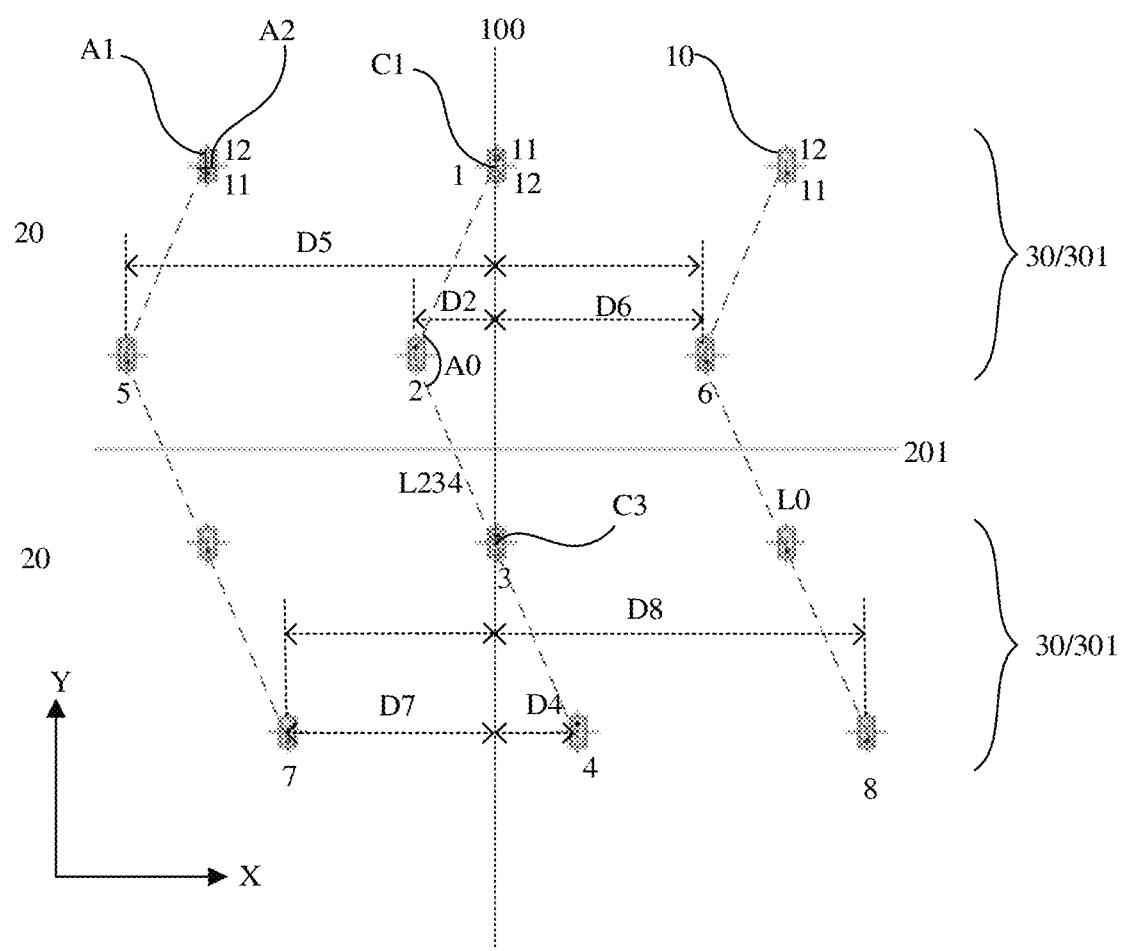
FIG. 4 is a schematic diagram of light-emitting elements in two partitions that are adjacent to each other in the column direction in FIG. 3.

FIG. 3 is a schematic diagram of a light-emitting module provided by an embodiment of the present disclosure. FIG. 4 is a schematic diagram of light-emitting elements in two partitions that are adjacent to each other in the column direction in FIG. 3.

As illustrated in FIG. 3, the light-emitting module includes a plurality of partitions 20, and each partition 20 includes a plurality of light-emitting elements 10. The light-emitting elements 10 in each partition 20 can be driven by one or more driving chips. For example, the light-emitting elements 10 in each partition 20 can be turned on simultaneously, but not limited thereto. The way of partition driving is beneficial to improving the resolution. A rectangular frame in FIG. 3 is a partition 20. FIG. 3 is illustrated by taking the case where six light-emitting elements 10 are in one partition 20 as an example.

As illustrated in FIG. 3, the plurality of partitions 20 are arranged in a row direction X and a column direction Y.

As illustrated in FIG. 3 and FIG. 4, the light-emitting module includes the plurality of light-emitting elements 10, the plurality of light-emitting elements 10 are arranged in the row direction X and the column direction Y, and two adjacent rows of light-emitting elements 10 are arranged in a staggered manner. As illustrated in FIG. 4, the same column of light-emitting elements 10 include a first light-emitting element 1, a second light-emitting element 2, a third light-emitting element 3, and a fourth light-emitting element 4 that are arranged sequentially, and the second light-emitting element 2 and the fourth light-emitting element 4 are arranged on both sides of a center connection line of the first light-emitting element 1 and the third light-emitting element 3, respectively.

In the light-emitting module provided by the embodiments of the present disclosure, by adjusting the arrangement position and arrangement manner of the light-emitting elements, the second light-emitting element 2 and the fourth light-emitting element 4, in the first light-emitting element 1, the second light-emitting element 2, the third light-emitting element 3, and the fourth light-emitting element 4 that are sequentially adjacent to each other in the same column, are arranged on both sides of the center connection line 100 of the first light-emitting element 1 and the third light-emitting element 3, respectively. With this arrangement, the amount of light-emitting elements at an edge of the light-emitting module is relatively small, which is beneficial to reducing the luminous flux at the edge of the light-emitting module and improving the image quality. In the case that the light-emitting elements 10 all emit a blue light, the arrangement of the light-emitting elements in the light-emitting module provided by the embodiments of the present disclosure can avoid or alleviate the problem of peripheral blueness.

As illustrated in FIG. 3 and FIG. 4, the plurality of columns of light-emitting elements are arranged sequentially in the row direction X, and the light-emitting elements in each column of light-emitting elements are arranged in the column direction Y.

FIG. 3 illustrates a center connection line 60 of light-emitting elements 10 in one column of light-emitting elements. As illustrated in FIG. 3, the center connection line 60 is in the shape of a polyline. As illustrated in FIG. 3, the center connection line 60 includes a plurality of repeating portions 600, and the amount of light-emitting elements connected to the repeating portion 600 of the center connection line 60 is greater than three. As illustrated in FIG. 3, the amount of light-emitting elements connected to the repeating portion 600 of the center connection line 60 is five. For example, the repeating portions 600 refer to that the center connection line 60 includes a plurality of portions with the same shape. In some embodiments, the repeating portions 600 refer to that the center connection line 60 includes a plurality of portions with the same shape and with the same size. FIG. 3 is illustrated by taking the case where the plurality of repeating portions 600 are of the same shape and are of the same size as an example. The dots in the partition 20 represented by each rectangular frame in FIG. 3 represent the light-emitting elements 10. FIG. 3 is illustrated by taking the case where one repeating portion 600 is connected to five light-emitting elements as an example, but it is not limited thereto, and the amount of light-emitting elements connected to each repeating portion 600 can be determined according to requirements. Of course, the way of dividing the repeating portions 600 is not limited to that illustrated in FIG. 3.

As illustrated in FIG. 3, three light-emitting elements are arranged between two adjacent light-emitting elements 10 (a light-emitting element 101 and a light-emitting element 102) closest to the edge of the light-emitting module. That is, the amount of light-emitting elements between two adjacent light-emitting elements 10 (the light-emitting element 101 and the light-emitting element 102) closest to the edge of the light-emitting module is more than one. As illustrated in FIG. 3, three light-emitting elements are arranged between two light-emitting elements 10 (the light-emitting element 101 and the light-emitting element 102), closest to the edge of the light-emitting module, in two adjacent repeating portions 600 in the column direction Y. That is, the amount of light-emitting elements between two light-emitting elements 10 (the light-emitting element 101 and the light-emitting element 102), closest to the edge of the light-emitting module, in two adjacent repeating portions 600 in the column direction Y is more than one.

As illustrated in FIG. 3, a center connection line 60 on the left side of the light-emitting module and a center connection line 60 on the right side of the light-emitting module are both in the shape of a polyline. As illustrated in FIG. 3, the bending manner of the center connection line 60 on the left side of the light-emitting module is identical to the bending manner of the center connection line 60 on the right side of the light-emitting module. In the embodiments of the present disclosure, the center connection line 60 on the left side of the light-emitting module and the center connection line 60 on the right side of the light-emitting module can be coincident after being translated.

FIG. 3 illustrates a center C0 of the light-emitting module and a center line CL passing through the center C0. The center line CL extends in the column direction Y. The center connection line 60 on the left side of the light-emitting module and the center connection line 60 on the right side of the light-emitting module can be regarded as the center connection line 60 of two columns of light-emitting elements located on both sides of the center line CL.

FIG. 3 illustrates that the light-emitting module is in the shape of a rectangle, and is provided with an edge E1, an edge E2, an edge E3, and an edge E4, the edge E1 and the edge E3 are opposite to each other, and both extend in the column direction Y, and the edge E2 and the edge E4 are opposite to each other, and both extend in the row direction X.

In the embodiments of the present disclosure, the edge E1, the edge E2, the edge E3, and the edge E4 may be referred to as a left edge, an upper edge, a right edge, and a lower edge, respectively.

In the embodiments of the present disclosure, the center of the light-emitting element 10 refers to the geometric center of the light-emitting element 10. For example, the center of the light-emitting element 10 refers to the center of gravity of the light-emitting element 10, but is not limited thereto.

As illustrated in FIG. 3, each column of light-emitting elements of the light-emitting module is a column of light-emitting elements with a center connection line of a polyline. As illustrated in FIG. 3, each row of light-emitting elements of the light-emitting module is a row of light-emitting elements with a center connection line of a straight line. Therefore, in the four edges of the light-emitting module illustrated in FIG. 3, a column of light-emitting elements with a center connection line of a polyline is provided at each edge of two edges extending in the column direction Y, and a row of light-emitting elements with a center connection line of a straight line is provided at each edge of two edges extending in the row direction X. That is, at the four edges of the light-emitting module, the column of light-emitting elements at the left edge is a column of light-emitting elements with a center connection line of a polyline, the column of light-emitting elements at the right edge is a column of light-emitting elements with a center connection line of a polyline, the row of light-emitting elements at the upper edge is a row of light-emitting elements with a center connection line of a straight line, and the row of light-emitting elements at the lower edge is a row of light-emitting elements with a center connection line of a straight line.

As illustrated in FIG. 3, the center connection line of the light-emitting elements of each column of light-emitting elements m0 is a polyline. In the embodiments of the present disclosure, a column of light-emitting elements are arranged in the column direction Y, but it is not required that the light-emitting elements in the column are all on a straight line, as long as the arrangement trend of a column of light-emitting elements is in the column direction Y.

FIG. 4 illustrates four rows and three columns of light-emitting elements. As illustrated in FIG. 4, the second light-emitting element 2 is arranged on the left side of the center connection line 100 of the first light-emitting element 1 and the third light-emitting element 3, and the fourth light-emitting element 4 is arranged on the right side of the center connection line 100 of the first light-emitting element 1 and the third light-emitting element 3. For example, as illustrated in FIG. 3 and FIG. 4, a plurality of columns of light-emitting elements are arranged in the same manner. As illustrated in FIG. 3 and FIG. 4, light-emitting elements in different columns can be coincident after being translated. As illustrated in FIG. 3 and FIG. 4, light-emitting elements in different columns can be coincident after being translated in the row direction X.

As illustrated in FIG. 4, every two adjacent rows of light-emitting elements 10 constitute a light-emitting element group 30, different light-emitting element groups 30 include different light-emitting elements 10, and staggered directions of two adjacent light-emitting element groups 30 are opposite to each other to facilitate reducing the luminous flux at the edges of the light-emitting module and improving the image quality. For example, the staggered direction refers to a staggered direction of a row of light-emitting elements that are staggered relative to a row of light-emitting elements that are not staggered.

As illustrated in FIG. 4, the light-emitting element group 30 includes a light-emitting element group 301 and a light-emitting element group 302. In two rows of light-emitting elements of the light-emitting element group 301, a lower row of light-emitting elements is staggered to the left relative to an upper row of light-emitting elements; and in two rows of light-emitting elements in the light-emitting element group 302, a lower row of light-emitting elements is staggered to the right relative to an upper row of light-emitting elements.

As illustrated in FIG. 4, the first row of light-emitting elements is a row of light-emitting elements that are not staggered, and the second row of light-emitting elements is a row of light-emitting elements that are staggered to the left relative to the first row of light-emitting elements.

As illustrated in FIG. 4, the third row of light-emitting elements is a row of light-emitting elements that are not staggered, and the fourth row of light-emitting elements is a row of light-emitting elements that are staggered to the right relative to the third row of light-emitting elements.

As illustrated in FIG. 4, the staggered manners of the light-emitting elements of two adjacent light-emitting element groups in the column direction Y are different.

As illustrated in FIG. 4, the arrangements of the light-emitting elements of two adjacent light-emitting element groups in the column direction Y are different.

As illustrated in FIG. 3 and FIG. 4, the embodiments of the present disclosure are described by taking the case where the odd-numbered rows are not staggered and the even-numbered rows are staggered as an example, but are not limited thereto. In other embodiments, the odd-numbered rows may be staggered while the even-numbered rows are not staggered.

For example, as illustrated in FIG. 4, the plurality of light-emitting elements 10 further include a fifth light-emitting element 5 and a sixth light-emitting element 6, the fifth light-emitting element 5 and the sixth light-emitting element 6 are located in the same row as the second light-emitting element 2 and are adjacent to the second light-emitting element 2, respectively, a distance D5 from the fifth light-emitting element 5 to the center connection line 100 of the first light-emitting element 1 and the third light-emitting element 3 is greater than a distance D6 from the sixth light-emitting element 6 to the center connection line 100 of the first light-emitting element 1 and the third light-emitting element 3, and a distance D2 from the second light-emitting element 2 to the center connection line 100 of the first light-emitting element 1 and the third light-emitting element 3 is less than the distance D6 from the sixth light-emitting element 6 to the center connection line 100 of the first light-emitting element 1 and the third light-emitting element 3. Therefore, the second row of light-emitting elements illustrated in FIG. 4 are staggered to the left relative to the first row of light-emitting elements.

For example, as illustrated in FIG. 4, in order to obtain a better light mixing effect, the distance D6 from the sixth light-emitting element 6 to the center connection line 100 of the first light-emitting element 1 and the third light-emitting element 3 is 3 to 10 times the distance D2 from the second light-emitting element 2 to the center connection line 100 of the first light-emitting element 1 and the third light-emitting element 3. Further for example, the distance D6 is 3 to 8 times the distance D2.

For example, as illustrated in FIG. 4, the plurality of light-emitting elements 10 further include a seventh light-emitting element 7 and an eighth light-emitting element 8, the seventh light-emitting element 7 and the eighth light-emitting element 8 are located in the same row as the fourth light-emitting element 4 and are adjacent to the fourth light-emitting element 4, respectively, a distance D7 from the seventh light-emitting element 7 to the center connection line 100 of the first light-emitting element 1 and the third light-emitting element 3 is less than a distance D8 from the eighth light-emitting element 8 to the center connection line 100 of the first light-emitting element 1 and the third light-emitting element 3, and a distance D4 from the fourth light-emitting element 4 to the center connection line 100 of the first light-emitting element 1 and the third light-emitting element 3 is less than the distance D7 from the seventh light-emitting element 7 to the center connection line 100 of the first light-emitting element 1 and the third light-emitting element 3. Therefore, the fourth row of light-emitting elements illustrated in FIG. 4 are staggered to the right relative to the third row of light-emitting elements.

For example, as illustrated in FIG. 4, the first row of light-emitting elements are not staggered relative to the third row of light-emitting elements in the row direction X.

For example, as illustrated in FIG. 4, in order to obtain a better light mixing effect, the distance D7 from the seventh light-emitting element 7 to the center connection line 100 of the first light-emitting element 1 and the third light-emitting element 3 is 3 to 10 times the distance D4 from the fourth light-emitting element 4 to the center connection line 100 of the first light-emitting element 1 and the third light-emitting element 3. Further for example, the distance D7 is 3 to 8 times the distance D4.

For example, as illustrated in FIG. 4, in order to obtain a better light mixing effect, the distance D2 from the center of the second light-emitting element 2 to the center connection line 100 of the first light-emitting element 1 and the third light-emitting element 3 is equal to the distance D4 from the center of the fourth light-emitting element 4 to the center connection line 100 of the first light-emitting element 1 and the third light-emitting element 3. That is, the distance D2 is equal to the distance D4. This arrangement makes the leftward stagger distance of the second row of light-emitting elements relative to the first row of light-emitting elements equal to the rightward stagger distance of the fourth row of light-emitting elements relative to the third row of light-emitting elements.

For example, as illustrated in FIG. 4, the center connection line of the second light-emitting element 2, the third light-emitting element 3, and the fourth light-emitting element 4 is on a straight line L234.

For example, as illustrated in FIG. 4, an included angle A0 between the center connection line 100 of the first light-emitting element 1 and the second light-emitting element 2 and the straight line L234 is an obtuse angle. For example, the obtuse angle is greater than or equal to 120 degrees and less than or equal to 160 degrees.

FIG. 4 illustrates the center C1 of the first light-emitting element 1 and the center C3 of the third light-emitting element 3. For example, the center of each light-emitting element may be the center of gravity of the light-emitting element, but is not limited thereto.

FIG. 4 illustrates a first electrode 11 and a second electrode 12 of the light-emitting element. One of the first electrode 11 and the second electrode 12 may be a P electrode, and the other of the first electrode 11 and the second electrode 12 may be an N electrode. For example, the center of each light-emitting element may be located between the first electrode 11 and the second electrode 12.

For example, as illustrated in FIG. 4, distances between two adjacent light-emitting elements 10 located in the same row are equal to each other. For example, as illustrated in FIG. 4, distances between two adjacent light-emitting elements 10 located in the same column are equal to each other in the column direction Y.

For example, in the embodiments of the present disclosure, the row direction X intersects with the column direction Y. For example, the row direction X is the horizontal direction, and the column direction Y is the vertical direction. The embodiments of the present disclosure are described by taking the case where the row direction X is perpendicular to the column direction Y as an example. The overall trend of the plurality of light-emitting elements 10 in the column direction Y is in the column direction, and it is not required that the plurality of light-emitting elements 10 in the column direction Y are arranged in a straight line. The light-emitting elements in the same column may be arranged in a non-linear such as a polyline manner.

Referring to FIG. 3 and FIG. 4, in a column of partitions 20, the light-emitting elements in two partitions 20 in every other row are arranged in the same way. As illustrated in FIG. 3, the light-emitting elements in the even-numbered rows of partitions 20 are arranged in the same way, and the light-emitting elements in the odd-numbered rows of partitions 20 are arranged in the same way. As illustrated in FIG. 3, the light-emitting elements in the even-numbered rows of partitions are arranged in a different way from the light-emitting elements in the odd-numbered rows of partitions. For example, each partition 20 includes at least two light-emitting elements among the plurality of light-emitting elements. With this arrangement, the light-emitting elements at the edges of the light-emitting module are relatively less, which can avoid or alleviate the problem of peripheral blueness.

Figure 5:
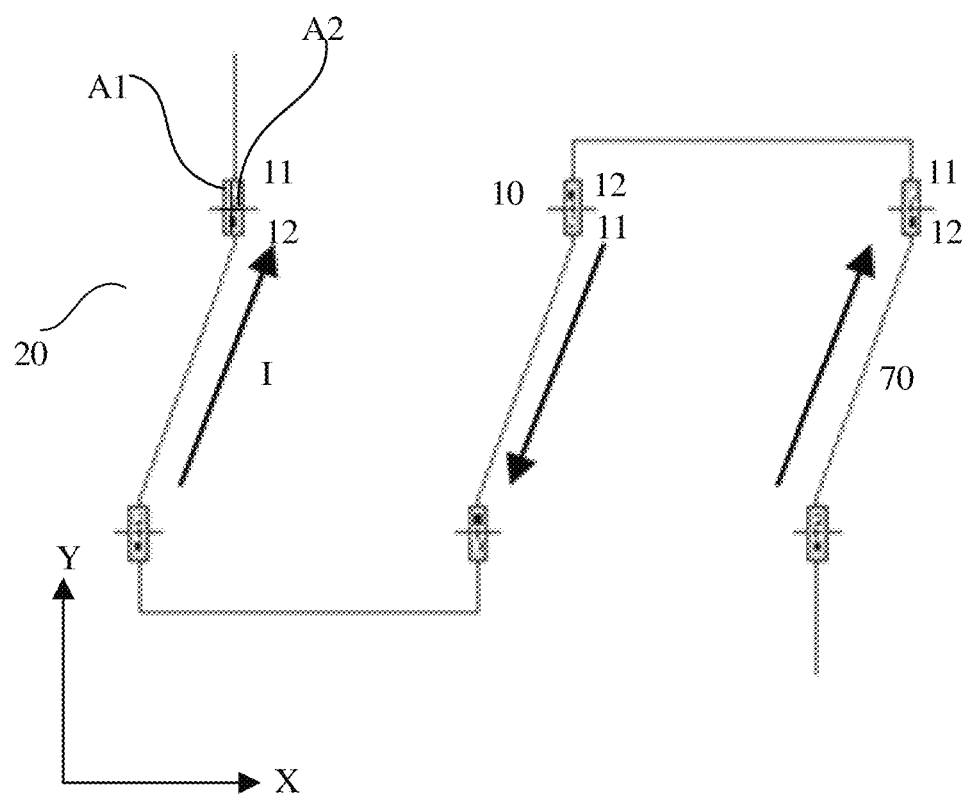
FIG. 5 is a schematic diagram of an arrangement of light-emitting elements in a light-emitting module provided by an embodiment of the present disclosure.

FIG. 5 is a schematic diagram of an arrangement of light-emitting elements in a light-emitting module provided by an embodiment of the present disclosure.

For example, as illustrated in FIG. 4 and FIG. 5, the light-emitting element 10 includes the first electrode 11 and the second electrode 12, and the arrangement directions of first electrodes 11 and second electrodes 12 of two adjacent light-emitting elements 10 in the same row are different. Therefore, the first electrodes 11 and the second electrodes 12 of two adjacent light-emitting elements in the same row are arranged in an opposite manner, so that the wires in the layout is simple, the wiring arrangement is simplified, the sound of current flow is effectively reduced, and the oscillation frequency caused by the ampere force generated by the interaction of the reverse currents is effectively reduced.

For example, as illustrated in FIG. 4 and FIG. 5, the arrangement directions of the first electrodes and the second electrodes of two adjacent light-emitting elements 10 located in the same row are opposite to each other. As illustrated in FIG. 4, in the first row of light-emitting elements, the first electrode 11 and the second electrode 12 in the second column of light-emitting elements are arranged from top to bottom, and the first electrode 11 and second electrode 12 of the third column of light-emitting elements are arranged from bottom to top.

For example, as illustrated in FIG. 4 and FIG. 5, the light-emitting element 10 is provided with a long axis A1 and a short axis A2, the extending direction of the long axis A1 is perpendicular to the extending direction of the short axis A2, the length of the long axis A1 is greater than the length of the short axis A2, and the arrangement direction of the first electrode 11 and the second electrode 12 of the light-emitting element is the extending direction of the long axis A1. For example, the long axis A1 is a center connection line of two opposite short sides of the light-emitting element 10, and the short axis A2 is a center connection line of two opposite long sides of the light-emitting element 10.

For example, as illustrated in FIG. 4 and FIG. 5, the extending direction of the long axis A1 of each light-emitting element 10 is the column direction Y, and the extending direction of the short axis A2 of each light-emitting element 10 is the row direction X.

FIG. 5 illustrates a wire 70 and a current I in the wire 70.

Figure 6:
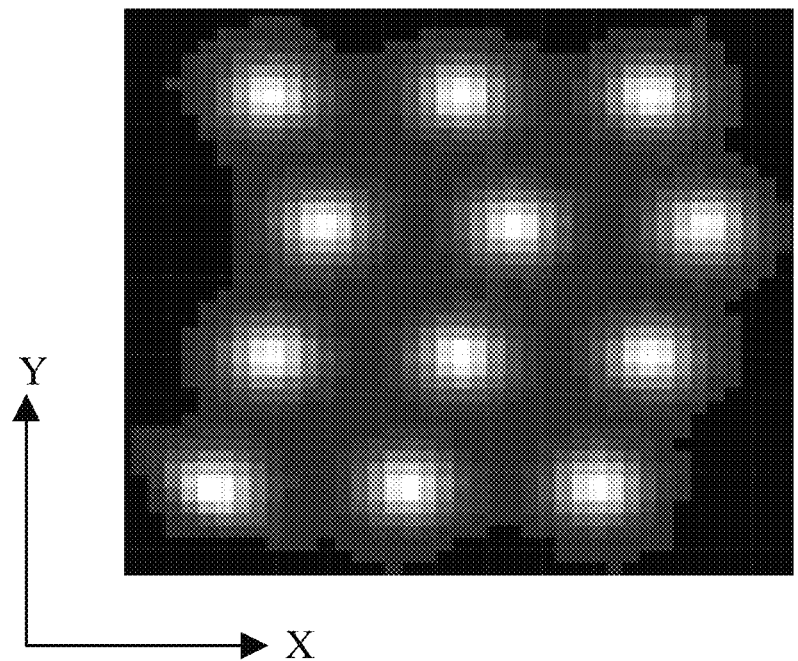
FIG. 6 is a diagram illustrating light mixing effect of a light-emitting module adopting an arrangement of light-emitting elements in FIG. 4.

FIG. 6 is a diagram illustrating light mixing effect of a light-emitting module adopting the arrangement of light-emitting elements in FIG. 4. As illustrated in FIG. 6, with this arrangement, the light mixing effect of the adjacent light-emitting elements is uniform without darkening; in addition, the luminous flux of the edges of the light-emitting module is less than the luminous flux of the rectangular arrangement; adopting this arrangement can not only effectively improve the image quality, but also effectively reduce the amount of light-emitting elements (for example, increasing the current of the light-emitting elements to achieve brightness), thereby reducing costs. In the case that the light-emitting elements all emit a blue light, this arrangement can effectively solve the problem of peripheral blueness.

Figure 7:
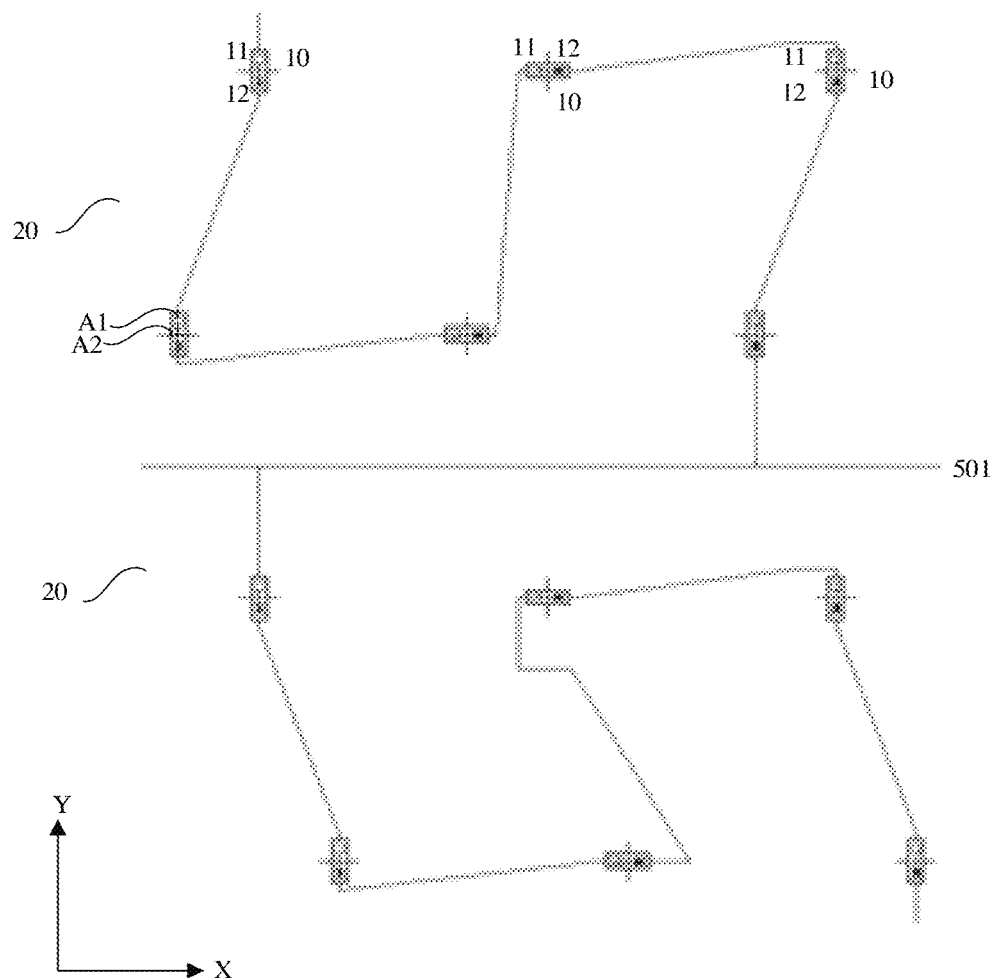
FIG. 7 is a schematic diagram of an arrangement of light-emitting elements in a light-emitting module provided by an embodiment of the present disclosure.

FIG. 7 is a schematic diagram of an arrangement of light-emitting elements in a light-emitting module provided by an embodiment of the present disclosure.

For example, as illustrated in FIG. 7, the extending direction of the long axis A1 of the light-emitting element 10 in one of the odd-numbered column and the even-numbered column is the column direction Y, and the extending direction of the long axis A1 of the light-emitting element 10 in the other of the odd-numbered column and the even-numbered column is the row direction X.

For example, as illustrated in FIG. 7, the extending direction of the long axis A1 of the light-emitting element 10 in one of the odd-numbered column and the even-numbered column is perpendicular to the extending direction of the long axis A1 of the light-emitting element 10 in the other of the odd-numbered column and the even-numbered column.

For example, as illustrated in FIG. 7, that is, the light-emitting elements 10 in the odd-numbered columns are placed vertically, and the light-emitting elements 10 in even-numbered columns are placed horizontally.

As illustrated in FIG. 7, the light-emitting elements 10 in one of the odd-numbered column and the even-numbered column are placed in the column direction Y, and the light-emitting elements 10 in the other of the odd-numbered column and the even-numbered column are placed in the row direction X, and two light-emitting elements 10 in adjacent columns and in the same row are placed in a different manner, that is, one light-emitting element is placed in the column direction Y, and the other light-emitting element is placed in the row direction X.

For example, as illustrated in FIG. 7, the extending direction of the long axis of one column of light-emitting elements 10 of two adjacent columns of light-emitting elements 10 is parallel to the column direction Y, and the extending direction of the long axis of the other column of light-emitting elements 10 of the two adjacent columns of light-emitting elements 10 is parallel to the row direction X.

In the embodiments of the present disclosure, being placed vertically, being placed in the column direction Y, being placed horizontally, and being placed in the row direction X all refer to the arrangement manner of the arrangement direction of the first electrode 11 and the second electrode 12 of the light-emitting element 10, or refer to the arrangement manner of the extending direction of the long axis A1 of the light-emitting element 10.

FIG. 7 illustrates a diving line 501 extending in the row direction between different partitions 20. The diving line 501 illustrated in FIG. 7 is a part of the rectangular frame representing the partition 20 illustrated in FIG. 3.

Figure 8:
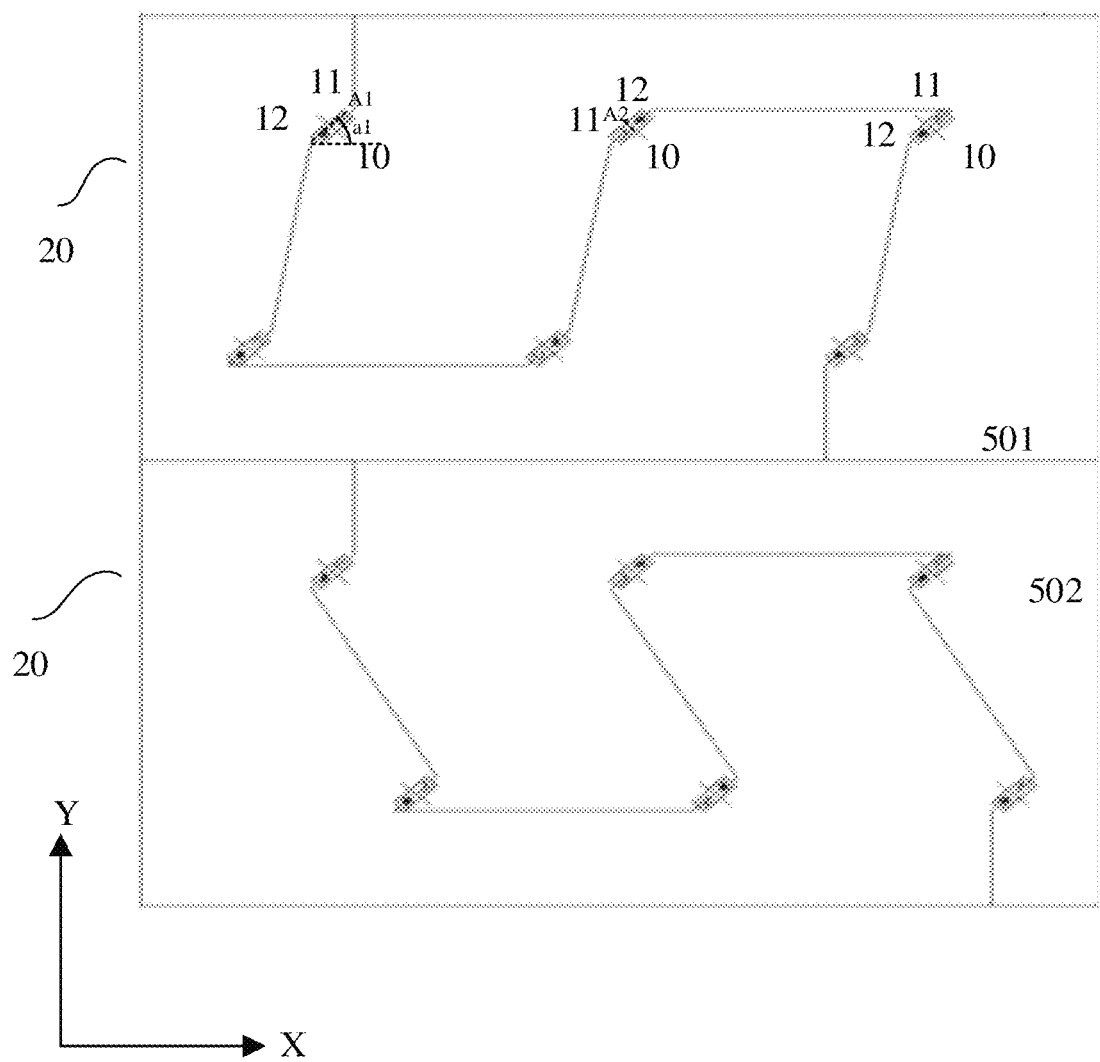
FIG. 8 is a schematic diagram of an arrangement of light-emitting elements in a light-emitting module provided by an embodiment of the present disclosure.

FIG. 8 is a schematic diagram of an arrangement of light-emitting elements in a light-emitting module provided by an embodiment of the present disclosure.

For example, as illustrated in FIG. 8, an included angle a1 between the extending direction of the long axis A1 of at least one light-emitting element 10 among the plurality of light-emitting elements 10 and the row direction X is greater than zero.

For example, as illustrated in FIG. 8, the included angle a1 between the extending direction of the long axis A1 of at least one light-emitting element 10 among the plurality of light-emitting elements 10 and the row direction X is greater than zero and less than or equal to 45 degrees.

As illustrated in FIG. 8, the inclination directions of the plurality of light-emitting elements 10 are the same, and the inclination angles of the plurality of light-emitting elements 10 are the same. The light-emitting module illustrated in FIG. 8 is described by taking the case where the light-emitting element 10 is inclined to the right by 45° as an example.

FIG. 8 illustrates a diving line 501 extending in the row direction and a diving line 502 extending in the column direction between different partitions 20.

For example, as illustrated in FIG. 3, FIG. 4, FIG. 7 and FIG. 8, in the embodiments of the present disclosure, each partition is provided with a total of 6 light-emitting elements in two rows and three columns.

For example, as illustrated in FIG. 3 to FIG. 5, FIG. 7 and FIG. 8, in the same partition 20, four adjacent light-emitting elements form a parallelogram arrangement.

Figure 9:
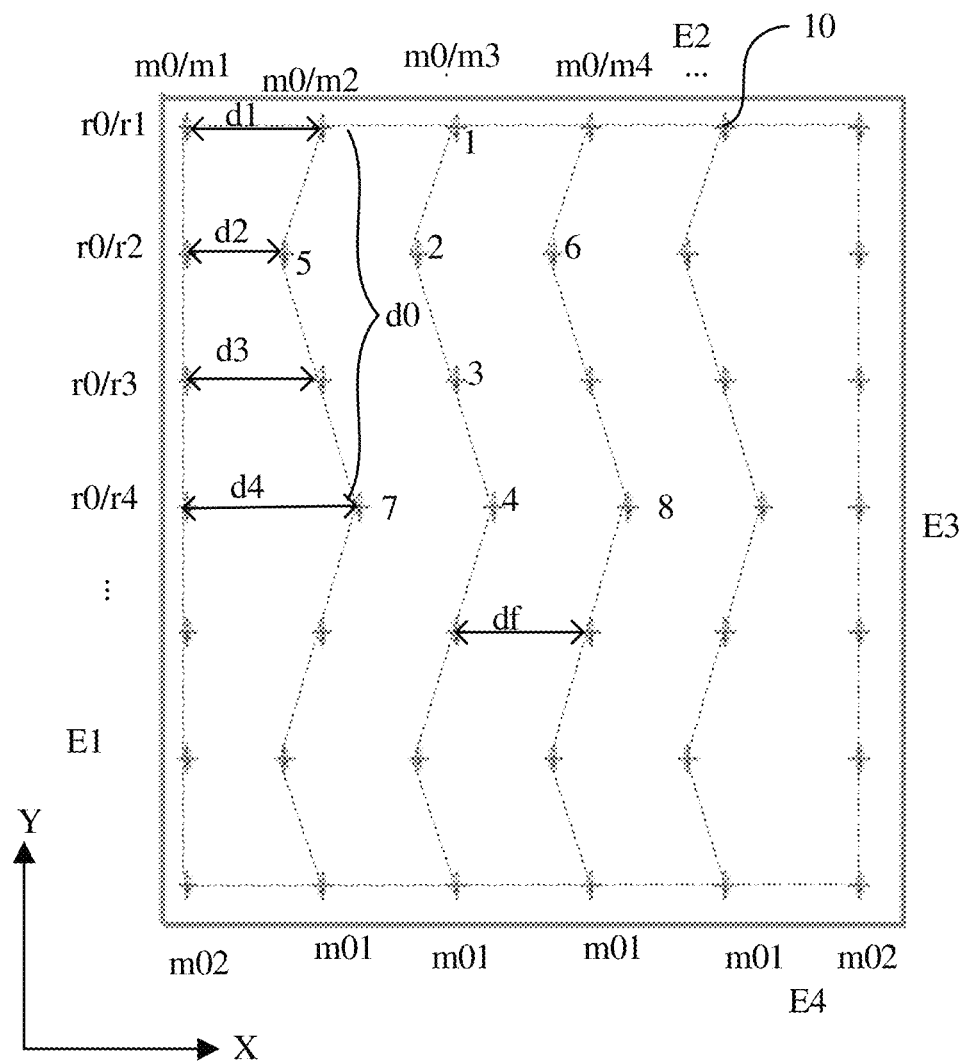
FIG. 9 is a schematic diagram of a light-emitting module provided by an embodiment of the present disclosure.
Figure 10:
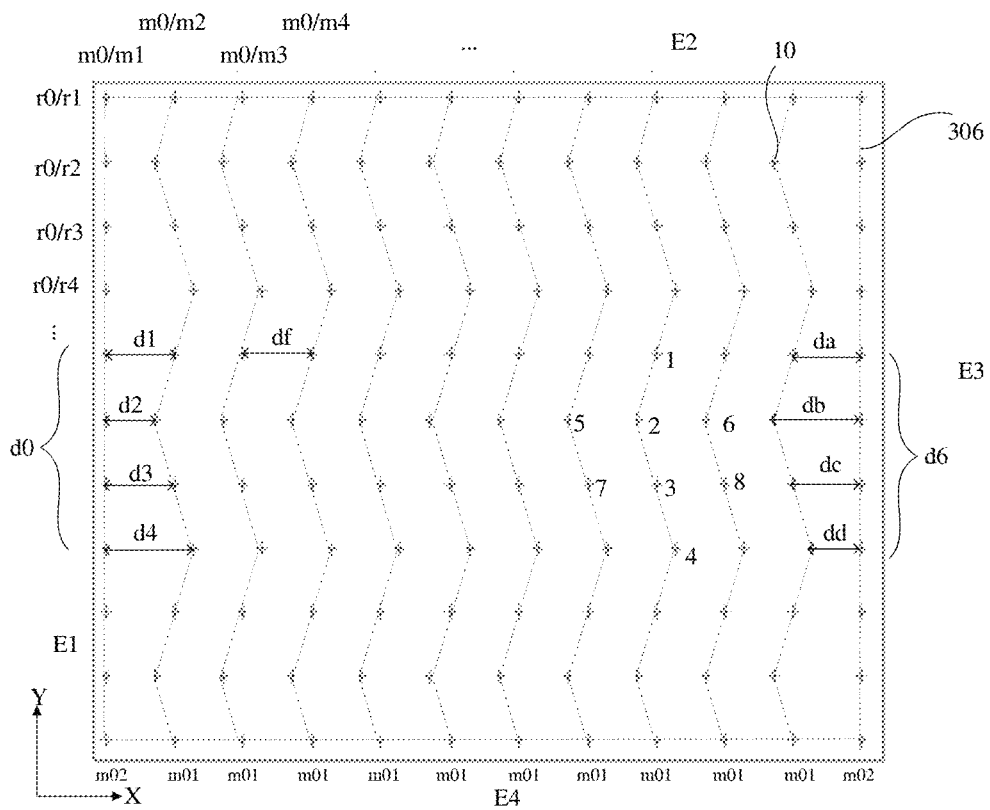
FIG. 10 is a schematic diagram of a display device provided by an embodiment of the present disclosure.

FIG. 9 is a schematic diagram of a light-emitting module provided by an embodiment of the present disclosure. FIG. 10 is a schematic diagram of a light-emitting module provided by an embodiment of the present disclosure.

As illustrated in FIG. 9 and FIG. 10, in order to further improve the uniformity of brightness at a periphery of the light-emitting module and make the uniformity of the light source better, the light-emitting module is provided with at least one column of light-emitting elements, each with a center connection line of a straight line, at each of two opposite edges of the light-emitting module extending in the column direction.

FIG. 9 and FIG. 10 illustrate that the light-emitting module is in the shape of a rectangle, and the light-emitting module is provided with the edge E1, the edge E2, the edge E3, and the edge E4; the edge E1 and the edge E3 are arranged opposite to each other, and both extend in the column direction Y, and the edge E2 and the edge E4 are arranged opposite to each other, and both extend in the row direction X.

FIG. 9 and FIG. 10 are illustrated by taking the case where the light-emitting module is provided with one column of light-emitting elements with a center connection line of a straight line at the edge E1 and is provided with one column of light-emitting elements with a center connection line of a straight line at the edge E3 as an example, but not limited to those illustrated in FIG. 9 and FIG. 10. In other embodiments, the amount of columns of light-emitting elements with a center connection line of a straight line at the edge E1 can be determined according to requirements, and the amount of columns of light-emitting elements with a center connection line of a straight line at the edge E3 can be determined according to requirements.

For example, in order to avoid the problem of peripheral blueness and improve the uniformity of brightness at the periphery, the amount of columns of light-emitting elements with a center connection line of a straight line at the edge E1 is less than or equal to four, and the amount of columns of light-emitting elements with a center connection line of a straight line at the edge E3 is less than or equal to four. That is, the light-emitting module is provided with less than or equal to four columns of light-emitting elements with center connection lines of straight lines at the edge E1, and is provided with less than or equal to four columns of light-emitting elements with center connection lines of straight lines at the edge E3. At the edge E1, the plurality of columns of light-emitting elements with center connection lines of straight lines are arranged sequentially, and at the edge E3, the plurality of columns of light-emitting elements with center connection lines of straight lines are arranged sequentially.

As illustrated in FIG. 9 and FIG. 10, except for the edge E1 and the edge E3, each column of light-emitting elements of the light-emitting module is a column of light-emitting elements with a center connection line of a polyline. As illustrated in FIG. 9 and FIG. 10, each row of light-emitting elements of the light-emitting module is a row of light-emitting elements with a center connection line of a straight line. Therefore, among the four edges of the light-emitting module illustrated in FIG. 9 and FIG. 10, one column of light-emitting elements with a center connection line of a straight line is provided at each edge of the two edges extending in the column direction Y, and one row of light-emitting elements with a center connection line of a straight line is provided at each edge of the two edges extending in the row direction X.

As illustrated in FIG. 9 and FIG. 10, the center connection lines of the light-emitting elements are all straight lines at the four edges of the light-emitting module. In this way, an arrangement of light-emitting elements with internal staggered arrangement and four-edges linear arrangement is formed.

FIG. 9 and FIG. 10 illustrate a plurality of columns of light-emitting elements m0. FIG. 9 and FIG. 10 indicate a column of light-emitting elements m1, a column of light-emitting elements m2, a column of light-emitting elements m3, and a column of light-emitting elements m4.

FIG. 9 and FIG. 10 illustrate a plurality of rows of light-emitting elements r0. FIG. 9 and FIG. 10 indicate a row of light-emitting elements r1, a row of light-emitting elements r2, a row of light-emitting elements r3, and a row of light-emitting elements r4.

FIG. 9 and FIG. 10 are illustrated by taking the case where the light-emitting module includes seven rows of light-emitting elements r0 and six columns of light-emitting elements m0 as an example. However, the embodiments of the present disclosure include but are not limited thereto, and the amount of rows of light-emitting elements and the amount of columns of light-emitting elements may be determined according to requirements.

As illustrated in FIG. 9 and FIG. 10, the plurality of columns of light-emitting elements m0 include a plurality of first-type columns of light-emitting elements m01 and a plurality of second-type columns of light-emitting elements m02, a center connection line of light-emitting elements of each first-type column of light-emitting elements m01 of the plurality of first-type columns of light-emitting elements m01 is a polyline, a center connection line of light-emitting elements of each second-type column of light-emitting elements m02 of the plurality of second-type columns of light-emitting elements m02 is a straight line, and the plurality of first-type columns of light-emitting elements m01 are located between two second-type columns of light-emitting elements m02 of the plurality of second-type columns of light-emitting elements m02.

As illustrated in FIG. 9 and FIG. 10, the light-emitting module is in the shape of a rectangle and is provided with four edges (edge E1, edge E2, edge E3, and edge E4), a center connection line of light-emitting elements closest to each edge of the four edges is a straight line, and each column of light-emitting elements located in a rectangular frame 306 formed by four straight lines is a column of light-emitting elements with a center connection line of a polyline.

As illustrated in FIG. 9 and FIG. 10, the distance between light-emitting elements, with a center connection line of a polyline, of a column of light-emitting elements closest to an edge of the light-emitting module extending in the column direction Y and light-emitting elements, with a center connection line of a straight line, of a column of light-emitting elements closest to the edge of the light-emitting module extending in the column direction Y decreases first and then gradually increases in the column direction Y.

As illustrated in FIG. 9 and FIG. 10, the distance between light-emitting elements, with a center connection line of a polyline, of a column of light-emitting elements closest to an edge of the light-emitting module extending in the column direction Y and light-emitting elements, with a center connection line of a straight line, of a column of light-emitting elements closest to the edge of the light-emitting module extending in the column direction Y include a distance d1, a distance d2, a distance d3, and a distance d4. The distance d1, the distance d2, the distance d3, and the distance d4 are arranged sequentially in the column direction Y. The distance d1 is greater than the distance d2, the distance d2 is less than the distance d3, and the distance d3 is less than the distance d4.

As illustrated in FIG. 9 and FIG. 10, the distance d1, the distance d2, the distance d3, and the distance d4 constitute a distance group d0, and a plurality of distance groups d0 are arranged sequentially in the column direction Y.

For example, in some embodiments, the distance d1 is equal to the distance d3, but is not limited thereto.

As illustrated in FIG. 9 and FIG. 10, among the plurality of first-type column of light-emitting elements m01, the distance between two adjacent light-emitting elements 10 in the row direction X is distance df. For example, the distance d1 is equal to the distance df, the distance d2 is less than the distance df, the distance d3 is equal to the distance df, and the distance d4 is greater than the distance df.

As illustrated in FIG. 9 and FIG. 10, the distance d1, the distance d2, the distance d3, and the distance d4 are respectively the minimum distance between a first light-emitting element 1, a second light-emitting element 2, a third light-emitting element 3, and a fourth light-emitting element 4 of a first-type column of light-emitting elements m01 closest to an edge extending in the column direction Y and light-emitting elements of a second-type column of light-emitting elements m02 closest to the first-type column of light-emitting elements m01. The distance d1, the distance d2, the distance d3, and the distance d4 may also be regarded as the minimum distance between the first light-emitting element 1, the second light-emitting element 2, the third light-emitting element 3, and the fourth light-emitting element 4 of the first-type column of light-emitting elements m01 closest to an edge extending in the column direction Y and a straight line where a center connection line of light-emitting elements of the second-type column of light-emitting elements m02 closest to the first-type column of light-emitting elements m01 is located.

As illustrated in FIG. 10, at the edge E3, the minimum distance between the first light-emitting element 1, the second light-emitting element 2, the third light-emitting element 3, and the fourth light-emitting element 4 of the first-type column of light-emitting elements m01 closest to an edge extending in the column direction Y and the straight line where the center connection line of light-emitting elements of the second-type column of light-emitting elements m02 closest to the first-type column of light-emitting elements m01 is located increases first and then gradually decreases.

As illustrated in FIG. 10, at the edge E3, the minimum distance between the first light-emitting element 1, the second light-emitting element 2, the third light-emitting element 3, and the fourth light-emitting element 4 of the first-type column of light-emitting elements m01 closest to an edge extending in the column direction Y and the straight line where the center connection line of light-emitting elements of the second-type column of light-emitting elements m02 closest to the first-type column of light-emitting elements m01 is located is a distance da, a distance db, a distance dc, and a distance dd, respectively.

For example, as illustrated in FIG. 10, the distance da is less than the distance db, the distance db is greater than the distance dc, and the distance dc is greater than the distance dd, but not limited thereto.

For example, as illustrated in FIG. 10, the distance da is equal to the distance df, the distance db is greater than the distance df, the distance dc is equal to the distance df, and the distance dd is less than the distance df, but not limited thereto.

For example, as illustrated in FIG. 10, the distance da, the distance db, the distance dc, and the distance dd constitute a distance group d6, and a plurality of distance groups d6 are arranged sequentially in the column direction Y.

For example, as illustrated in FIG. 10, the distance group d0 and the distance group d6 are located at both ends of four rows of light-emitting elements, respectively.

For example, as illustrated in FIG. 10, the distance d1 and the distance da are located at both ends of the same row of light-emitting elements, respectively; the distance d2 and the distance db are located at both ends of the same row of light-emitting elements, respectively; the distance d3 and the distance dc are located at both ends of the same row of light-emitting elements, respectively; and the distance d4 and the distance dd are located at both ends of the same row of light-emitting elements, respectively.

The light-emitting module provided by the embodiments of the present disclosure can be manufactured by using a common process, which is convenient for mass production.

Figure 11:
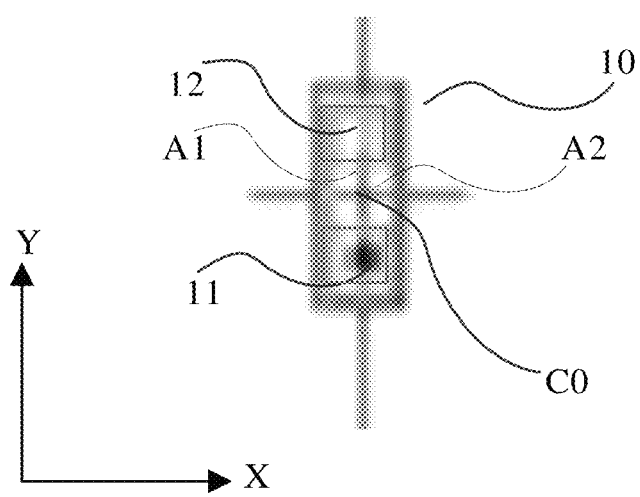
FIG. 11 is a schematic plan view of a light-emitting element in a light-emitting module provided by an embodiment of the present disclosure.

FIG. 11 is a schematic plan view of a light-emitting element in a light-emitting module provided by an embodiment of the present disclosure. In the embodiments of the present disclosure, as illustrated in FIG. 4, FIG. 5, FIG. 7, FIG. 8, and FIG. 11, the center C0 of the light-emitting element 10 may refer to a center of a connection line of the first electrode 11 and the second electrode 12 of the light-emitting element 10 in the arrangement direction. FIG. 11 is illustrated by taking the case where the first electrode 11 and the second electrode 12 are arranged in the column direction Y as an example.

As illustrated in FIG. 11, the center C0 of the light-emitting element 10 may refer to an intersection of a long axis A1 and a short axis A2.

For example, in the embodiments of the present disclosure, reference numeral 11 and reference numeral 12 may also refer to a pad connected to the first electrode and a pad connected to the second electrode, respectively.

An embodiment of the present disclosure further provides a light-emitting substrate, including any one of the above-mentioned light-emitting modules. The light-emitting substrate may also be called a light board.

An embodiment of the present disclosure further provides a display device, including any one of the above-mentioned light-emitting substrates.

Figure 12:
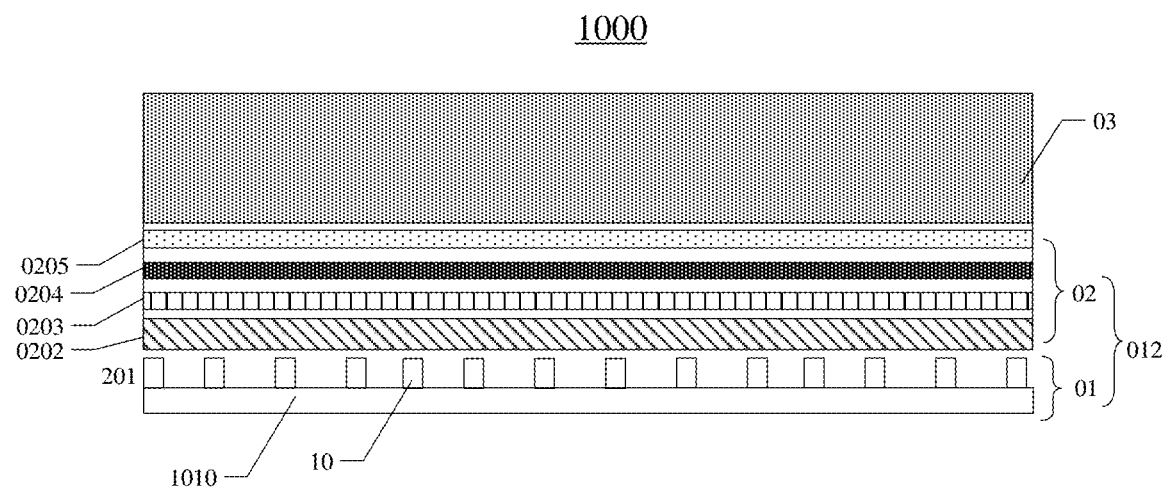
FIG. 12 is a schematic diagram of a display device provided by an embodiment of the present disclosure.

FIG. 12 is a schematic diagram of a display device provided by an embodiment of the present disclosure.

As illustrated in FIG. 12, the display device 1000 includes a light-emitting substrate 01, an optical layer 02, and a display panel 03, the optical layer 02 is provided on a side of the light-emitting substrate 01 away from a circuit board 1010, and the display panel 03 is provided on a side of the optical layer 02 away from the light-emitting substrate 01. FIG. 12 illustrates a light-emitting module 201.

For example, as illustrated in FIG. 12, the optical layer 02 includes a diffusion layer 0202, a quantum dot film layer 0203, a diffusion layer 0204, and a composite film layer 0205 that are arranged sequentially in a vertical direction away from the circuit board 1010. For example, the diffusion layer 0202 and the diffusion layer 0204 can avoid or alleviate the light shadow generated by the light-emitting substrate 01 and improve the display quality of the display device 1000. The quantum dot film layer 0203 can convert a blue light into a white light under the excitation of the blue light emitted by the light-emitting substrate 01, which can improve the utilization rate of light energy of the light-emitting substrate 01. The composite film layer 0205 can improve the brightness of light transmitted through the composite film layer 0205. For example, the optical layer 02 may further include other film layers to improve the optical performance of the display device 1000. The composite film layer 0205 may also be referred to as a brightness enhancement film.

For example, as illustrated in FIG. 12, the light-emitting substrate 01 and the optical layer 02 may constitute at least a part of a light source module 012 in the display device 1000. The display panel 03 is provided on a side of the light-emitting module 201 and is configured to protect various components in the display device 1000. For example, the display panel 03 may include a plurality of functional layers to achieve a better display effect. For example, the display panel 03 includes a liquid crystal display panel.

In the display device 1000 provided by the above-mentioned embodiments, the amount of light-emitting elements at the edges of the light-emitting module is relatively small, which is beneficial to reduce the luminous flux at the edges of the light-emitting module and improve the image quality. Thus, the display performance of the display device 1000 can be improved. In the case where the light-emitting elements 10 all emit a blue light, the arrangement manner of the light-emitting elements in the light-emitting module provided by the embodiments of the present disclosure can avoid or alleviate the problem of peripheral blueness.

For example, the display device includes a liquid crystal display device. For example, the display device includes any liquid crystal display product or component with a display function, such as a television, a digital camera, a mobile phone, a watch, a tablet computer, a notebook computer, a navigator, etc. that includes the above-mentioned light-emitting substrate.

What have been described above are only specific implementations of the present disclosure, the protection scope of the present disclosure is not limited thereto. Any modifications or substitutions easily occur to those skilled in the art within the technical scope of the present disclosure should be within the protection scope of the present disclosure. Therefore, the protection scope of the present disclosure should be based on the protection scope of the claims.

What is claimed is:

1. A light-emitting module, comprising a plurality of light-emitting elements,
wherein the plurality of light-emitting elements are arranged in a row direction and a column direction, the plurality of light-emitting elements are formed into a plurality of columns of light-emitting elements, at least one column of light-emitting elements among the plurality of columns of light-emitting elements comprises a first light-emitting element, a second light-emitting element, a third light-emitting element, and a fourth light-emitting element that are arranged sequentially, and the second light-emitting element and the fourth light-emitting element are arranged on both sides of a center connection line of the first light-emitting element and the third light-emitting element, respectively,
wherein the plurality of light-emitting elements further comprise a fifth light-emitting element and a sixth light-emitting element,
the fifth light-emitting element and the sixth light-emitting element are located in a same row as the second light-emitting element and are adjacent to the second light-emitting element, respectively, a distance from the fifth light-emitting element to the center connection line of the first light-emitting element and the third light-emitting element is greater than a distance from the sixth light-emitting element to the center connection line of the first light-emitting element and the third light-emitting element, and a distance from the second light-emitting element to the center connection line of the first light-emitting element and the third light-emitting element is less than the distance from the sixth light-emitting element to the center connection line of the first light-emitting element and the third light-emitting element.

2. The light-emitting module according to claim 1, wherein two adjacent rows of light-emitting elements are arranged in a staggered manner, each two adjacent rows of light-emitting elements constitute a light-emitting element group, different light-emitting element groups comprise different light-emitting elements, and staggered directions of two adjacent light-emitting element groups are opposite to each other.

3. The light-emitting module according to claim 1, wherein the distance from the sixth light-emitting element to the center connection line of the first light-emitting element and the third light-emitting element is 3 to 10 times the distance from the second light-emitting element to the center connection line of the first light-emitting element and the third light-emitting element.

4. The light-emitting module according to claim 1, wherein the plurality of light-emitting elements further comprise a seventh light-emitting element and an eighth light-emitting element,
the seventh light-emitting element and the eighth light-emitting element are located in a same row as the fourth light-emitting element and are adjacent to the fourth light-emitting element, respectively, a distance from the seventh light-emitting element to the center connection line of the first light-emitting element and the third light-emitting element is less than a distance from the eighth light-emitting element to the center connection line of the first light-emitting element and the third light-emitting element, and a distance from the fourth light-emitting element to the center connection line of the first light-emitting element and the third light-emitting element is less than the distance from the seventh light-emitting element to the center connection line of the first light-emitting element and the third light-emitting element.

5. The light-emitting module according to claim 1, wherein a distance from a center of the second light-emitting element to the center connection line of the first light-emitting element and the third light-emitting element is equal to a distance from a center of the fourth light-emitting element to the center connection line of the first light-emitting element and the third light-emitting element.

6. The light-emitting module according to claim 1, wherein a a of the second light-emitting element, the third light-emitting element, and the fourth light-emitting element is on a straight line,
wherein an included angle between the straight line and a center connection line of the first light-emitting element and the second light-emitting element is an obtuse angle, and
the obtuse angle is greater than or equal to 120 degrees and less than or equal to 160 degrees.

7. The light-emitting module according to claim 1, wherein the light-emitting module comprises two edges opposite to each other and extending in the column direction, and a center connection line of light-emitting elements in one column of light-emitting elements closest to each edge of the two edges extending in the column direction is a polyline.

8. The light-emitting module according to claim 1, wherein the light-emitting module comprises two edges opposite to each other and extending in the column direction, and a center connection line of light-emitting elements in one column of light-emitting elements closest to each edge of the two edges extending in the column direction is a straight line.

9. The light-emitting module according to claim 8, wherein the light-emitting module comprises two edges opposite to each other and extending in the row direction, and a center connection line of light-emitting elements in one row of light-emitting elements closest to each edge of the two edges extending in the row direction is a straight line.

10. The light-emitting module according to claim 8, wherein the plurality of columns of light-emitting elements comprise a plurality of first-type columns of light-emitting elements and a plurality of second-type columns of light-emitting elements, a center connection line of light-emitting elements of each first-type column of light-emitting elements of the plurality of first-type column of light-emitting elements is a polyline, a center connection line of light-emitting elements of each second-type column of light-emitting elements of the plurality of second-type columns of light-emitting elements is a straight line, and the plurality of first-type columns of light-emitting elements are located between two second-type columns of light-emitting elements of the plurality of second-type columns of light-emitting elements.

11. The light-emitting module according to claim 8, wherein a distance between light-emitting elements, with a center connection line of a polyline, of one column of light-emitting elements closest to an edge of the light-emitting module extending in the column direction and light-emitting elements, with a center connection line of a straight line, of one column of light-emitting elements closest to the edge of the light-emitting module extending in the column direction decreases first and then gradually increases or increases first and then gradually decreases in the column direction.

12. The light-emitting module according to claim 1, wherein the light-emitting module is in a shape of a rectangle and is provided with four edges, a center connection line of light-emitting elements closest to each edge of the four edges is a straight line, four straight lines collectively form a boundary of a rectangular frame, and each column of light-emitting elements located at an inner side of the boundary of the rectangular frame is a column of light-emitting elements with a center connection line of a polyline.

13. The light-emitting module according to claim 1, wherein each of the plurality of light-emitting elements comprises a first electrode and a second electrode, and an arrangement direction of the first electrode and the second electrode of one of two adjacent light-emitting elements located in a same row is different from an arrangement direction of the first electrode and the second electrode of the other of the two adjacent light-emitting elements located in the same row.

14. The light-emitting module according to claim 1, wherein the arrangement direction of the first electrode and the second electrode of one of two adjacent light-emitting elements located in the same row is opposite to the arrangement direction of the first electrode and the second electrode of the other of the two adjacent light-emitting elements located in the same row,
wherein the each of the plurality of light-emitting elements is provided with a long axis and a short axis, an extending direction of the long axis is perpendicular to an extending direction of the short axis, a length of the long axis is greater than a length of the short axis, and the arrangement direction of the first electrode and the second electrode of the light-emitting element is the extending direction of the long axis,
wherein the extending direction of the long axis of the light-emitting element in one of an odd-numbered column and an even-numbered column is the column direction, and the extending direction of the long axis of the light-emitting element in the other of the odd-numbered column and the even-numbered column is the row direction.

15. The light-emitting module according to claim 14, wherein an included angle between the extending direction of the long axis of at least one light-emitting element of the plurality of light-emitting elements and the row direction is greater than zero and less than or equal to 45 degrees.

16. The light-emitting module according to claim 1, wherein a center connection line of light-emitting elements of at least one column of light-emitting elements of the plurality of columns of light-emitting elements is in a shape of a polyline, the center connection line in the shape of the polyline comprises a plurality of repeating portions, and an amount of light-emitting elements connected to each of the plurality of repeating portions of the center connection line is greater than three.

17. The light-emitting module according to claim 1, wherein the light-emitting module comprises a plurality of partitions, the plurality of partitions are arranged in the row direction and the column direction, and each of the plurality of partitions comprises at least two light-emitting elements of the plurality of light-emitting elements; and light-emitting elements in even-numbered rows of partitions are arranged in a same way, light-emitting elements in odd-numbered rows of partitions are arranged in a same way, and the light-emitting elements in the even-numbered rows of partitions are arranged in a different way from the light-emitting elements in the odd-numbered rows of partitions.

18. A light-emitting substrate, comprising the light-emitting module according to claim 1.

19. A display device, comprising the light-emitting substrate according to claim 18.

\* \* \* \* \*